US011125627B2

United States Patent
Jenkner et al.

(10) Patent No.: US 11,125,627 B2
(45) Date of Patent: Sep. 21, 2021

(54) DEVICE AND METHOD FOR DETERMINING A TEMPERATURE OR A TEMPERATURE-DEPENDENT VALUE USABLE FOR DETERMINING THE TEMPERATURE, TEMPERATURE SENSOR, PRESSURE SENSOR AND COMBINATION SENSOR

(71) Applicant: Infineon Technologies AG, Neubiberg (DE)

(72) Inventors: Christian Jenkner, Klagenfurt (AT); Daniel Neumaier, Feldkirchen (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 770 days.

(21) Appl. No.: 15/909,618

(22) Filed: Mar. 1, 2018

(65) Prior Publication Data

US 2018/0252594 A1   Sep. 6, 2018

(30) Foreign Application Priority Data

Mar. 3, 2017   (DE) .......................... 102017104434.5

(51) Int. Cl.
*G01K 7/01*   (2006.01)
*G01K 15/00*   (2006.01)
(Continued)

(52) U.S. Cl.
CPC ................. *G01K 7/01* (2013.01); *G01K 1/20* (2013.01); *G01K 15/00* (2013.01); *G01K 15/005* (2013.01);
(Continued)

(58) Field of Classification Search
CPC ........ G01K 7/01; G01K 15/00; G01K 15/005; G01K 1/20; G01K 3/04; G01K 3/08;
(Continued)

(56) References Cited

U.S. PATENT DOCUMENTS 7,176,701 B2   2/2007   Wachi et al.
7,252,432 B1 *  8/2007   Henderson ............. G01K 1/026
                                                                327/513
(Continued)

FOREIGN PATENT DOCUMENTS

DE   102007025363 A1   7/2008

OTHER PUBLICATIONS

"Temperature Measurement System," ADM1024, www.onsemi.com; Mar. 9, 2017; 1 page.
(Continued)

*Primary Examiner* — Lisa M Caputo
*Assistant Examiner* — Janice M Soto
(74) *Attorney, Agent, or Firm* — Slater Matsil, LLP (57) ABSTRACT

In accordance with an embodiment, a device includes an interface configured for obtaining at least one measurement signal from a temperature sensor. In a first time interval the at least one measurement signal comprises information about a temperature-dependent voltage difference between a first temperature-dependent voltage at a first diode of the temperature sensor and a second temperature-dependent voltage at a second diode of the temperature sensor. In a second time interval the at least one measurement signal comprises information about a measurement value of a temperature-dependent voltage at a temperature-dependent electrical component of the temperature sensor.

13 Claims, 3 Drawing Sheets

(51) Int. Cl.
  *G01L 11/02* (2006.01)
  *G01K 1/20* (2006.01)
  *H03F 3/45* (2006.01)
  *H04R 1/04* (2006.01)

(52) U.S. Cl.
  CPC .......... *G01L 11/02* (2013.01); *H03F 3/45085* (2013.01); *H04R 1/04* (2013.01)

(58) Field of Classification Search
  CPC ....... G01K 3/10; G01L 11/02; H03F 3/45085; H04R 1/04
  USPC ... 374/178, 163, 1, 170, 141, 101–104, 171, 374/183; 702/99
  See application file for complete search history.

(56) References Cited

U.S. PATENT DOCUMENTS

| | | | |
|---|---|---|---|
| 8,210,743 B2 * | 7/2012 | Hasegawa | G01K 7/01 374/178 |
| 10,006,818 B2 * | 6/2018 | Sakano | G01K 7/01 |
| 2007/0286259 A1 * | 12/2007 | Kwon | G01K 15/00 374/170 |
| 2011/0158286 A1 * | 6/2011 | Peterson | G01K 7/01 374/170 |
| 2014/0112510 A1 | 4/2014 | Yang et al. | |

OTHER PUBLICATIONS

"Digital Barametric Pressure Sensor for Portable Devices," DPS310—Digital Pressure Sensor, Infineon Technology AG, Sep. 5, 2016; 41 pages.

* cited by examiner

DEVICE AND METHOD FOR DETERMINING A TEMPERATURE OR A TEMPERATURE-DEPENDENT VALUE USABLE FOR DETERMINING THE TEMPERATURE, TEMPERATURE SENSOR, PRESSURE SENSOR AND COMBINATION SENSOR

This application claims the benefit of German Application No. 102017104434.5, filed on Mar. 3, 2017, which application is hereby incorporated herein by reference in its entirety.

TECHNICAL FIELD

Exemplary embodiments are concerned with concepts for temperature sensors, more precisely, but not exclusively, with a device and a method for determining a temperature or a temperature-dependent value usable for determining the temperature, with a temperature sensor, with a pressure sensor and a combination sensor.

BACKGROUND

Temperature sensors are used in many applications. Besides ascertaining a temperature, for instance in a weather station, temperature sensors are often used to reduce temperature-dependent inaccuracies in measurements of other sensors, for instance pressure sensors.

SUMMARY

One example relates to a device for determining a temperature or a temperature-dependent value usable for determining the temperature. The device comprises an interface, configured for obtaining at least one measurement signal from a temperature sensor. In a first time interval the at least one measurement signal comprises information about a temperature-dependent voltage difference between a first temperature-dependent voltage at a first diode of the temperature sensor and a second temperature-dependent voltage at a second diode of the temperature sensor. In a second time interval the at least one measurement signal comprises information about a measurement value of a temperature-dependent voltage at a temperature-dependent electrical component of the temperature sensor. The device comprises a calculation module, configured for determining at least one first calibration measurement value at a first calibration temperature and a second calibration measurement value at a second calibration temperature in the first time interval on the basis of the information about the temperature-dependent voltage difference. The control module is configured for determining at least one first calibration voltage value at the temperature-dependent electrical component at the first calibration temperature and a second calibration voltage value at the temperature-dependent electrical component at the second calibration temperature in the first time interval. The control module is configured for determining the temperature or the temperature-dependent value usable for determining the temperature in the second time interval on the basis of the information about the measurement value of the temperature-dependent voltage at the temperature-dependent electrical component and on the basis of at least the first calibration voltage value or the second calibration voltage value.

One example relates to a temperature sensor comprising a first diode, a second diode and a control circuit. The control circuit is configured for providing at least one measurement signal to an interface to a device for determining a temperature or a temperature-dependent value usable for determining the temperature. The control circuit is configured to control a generation of the at least one measurement signal, such that in a first time interval the at least one measurement signal comprises information about a temperature-dependent voltage difference between a first temperature-dependent voltage at the first diode and a second temperature-dependent voltage at the second diode. The control circuit is configured to control the generation of the at least one measurement signal, such that in a second time interval the at least one measurement signal comprises information about a measurement value of a temperature-dependent voltage at a temperature-dependent electrical component of the temperature sensor.

One example relates to a method for determining a temperature or a temperature-dependent value usable for determining the temperature. The method comprises obtaining a first measurement signal from a temperature sensor in a first time interval. The first measurement signal comprises information about a temperature-dependent voltage difference between a first temperature-dependent voltage at a first diode of the temperature sensor and a second temperature-dependent voltage at a second diode of the temperature sensor. The method furthermore comprises determining at least one first calibration measurement value at a first calibration temperature and a second calibration measurement value at a second calibration temperature in the first time interval on the basis of the information about the temperature-dependent voltage difference. The method furthermore comprises determining at least one first calibration voltage value at the temperature-dependent electrical component at the first calibration temperature and a second calibration voltage value at the temperature-dependent electrical component at the second calibration temperature in the first time interval. The method furthermore comprises obtaining a second measurement signal from the temperature sensor in a second time interval comprising information about a measurement value of a temperature-dependent voltage at a temperature-dependent electrical component of the temperature sensor. The method furthermore comprises determining the temperature or the temperature-dependent value usable for determining the temperature in the second time interval on the basis of the information about the measurement value of the temperature-dependent voltage at the temperature-dependent electrical component and on the basis of at least the first calibration voltage value or the second calibration voltage value.

BRIEF DESCRIPTION OF THE DRAWINGS

Exemplary embodiments are explained in greater detail below with reference to the accompanying figures, in which.

DETAILED DESCRIPTION OF ILLUSTRATIVE EMBODIMENTS

Various exemplary embodiments will now be described more thoroughly with reference to the accompanying drawings, in which some exemplary embodiments are illustrated. In the figures, the thickness dimensions of lines, layers and/or regions may be illustrated in an exaggerated manner for the sake of clarity.

In the following description of the accompanying figures, which merely show some illustrative exemplary embodiments, identical reference signs may designate identical or comparable components. Furthermore, collective reference signs may be used for components and objects which occur multiply in an exemplary embodiment or in a drawing but are described jointly with regard to one or more features. Components or objects described with identical or collective reference signs, with regard to individual, a plurality or all of the features, for example their dimensionings, may be embodied identically, but possibly also differently, unless the description explicitly or implicitly reveals something else.

Although exemplary embodiments may be modified and altered in various ways, exemplary embodiments are illustrated as examples in the figures and are described thoroughly herein. It should be clarified, however, that the intention is not for exemplary embodiments to be restricted to the forms respectively disclosed, rather that exemplary embodiments are intended to cover all functional and/or structural modifications, equivalents and alternatives which lie within the scope of the invention. Identical reference signs designate identical or similar elements throughout the description of the figures.

It should be noted that one element referred to as being "connected" or "coupled" to another element may be directly connected or coupled to the other element or that intervening elements may be present.

The terminology used herein serves only to describe specific exemplary embodiments and is not intended to restrict the exemplary embodiments. As used herein, the singular forms "a", "an", "one" and "the" are also intended to include the plural forms, as long as the context does not clearly indicate something to the contrary. Furthermore, it should be clarified that the expressions such as e.g. "comprises", "comprising", "has" and/or "having", as used herein, indicate the presence of stated features, integers, steps, work sequences, elements and/or components, but do not preclude the presence or addition of one or a plurality of features, integers, steps, work sequences, elements, components and/or groups thereof.

As long as there is no definition to the contrary, all terms (including technical and scientific terms) used herein have the same meaning ascribed to them by a person of average skill in the art in the field with which the exemplary embodiments are associated. Furthermore, it should be clarified that expressions, e.g. those defined in dictionaries generally used, should be interpreted as if they had the meaning consistent with their meaning in the context of the relevant art, as long as a definition to the contrary is not expressly given herein.

Figure 1:
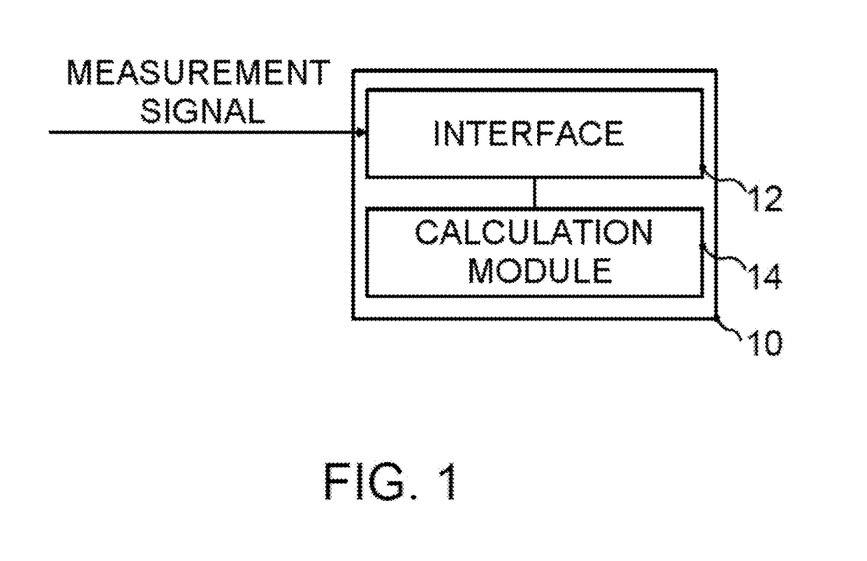
FIG. 1 shows a block diagram of a device for determining a temperature or a temperature-dependent value usable for determining the temperature.

FIG. 1 shows a block diagram of a device 10 for determining a temperature or a temperature-dependent value usable for determining the temperature. The device 10 comprises an interface 12, configured for obtaining at least one measurement signal from a temperature sensor. In a first time interval the at least one measurement signal comprises information about a temperature-dependent voltage difference between a first temperature-dependent voltage at a first diode of the temperature sensor and a second temperature-dependent voltage at a second diode of the temperature sensor. In a second time interval the at least one measurement signal comprises information about a measurement value of a temperature-dependent voltage at a temperature-dependent electrical component of the temperature sensor. The device 10 furthermore comprises a calculation module 14, configured for determining at least one first calibration measurement value at a first calibration temperature and a second calibration measurement value at a second calibration temperature in the first time interval on the basis of the information about the temperature-dependent voltage difference. The calculation module 14 is configured for determining at least one first calibration voltage value at the temperature-dependent electrical component at the first calibration temperature and a second calibration voltage value at the temperature-dependent electrical component at the second calibration temperature in the first time interval. The calculation module is configured for determining the temperature or the temperature-dependent value usable for determining the temperature in the second time interval on the basis of the information about the measurement value of the temperature-dependent voltage at the temperature-dependent electrical component and on the basis of at least the first calibration voltage value and/or the second calibration voltage value.

Determining the first calibration measurement value and the first calibration voltage value at the first calibration temperature and the second calibration measurement value and the second calibration voltage value at the second calibration temperature can enable for example a calibration of the temperature sensor in the first time interval within the device, which can enable a high accuracy of the calibration, without relying on an external temperature measurement. In the second time interval, for example, the temperature (or the temperature-dependent value usable for determining the temperature) can be determined by way of the measurement value of the temperature-dependent voltage at a temperature-dependent electrical component of the temperature sensor, which can enable the first and/or the second diode to be deactivated, and which can furthermore enable the temperature to be determined on the basis of a smaller number of measurement samples. In this regard, a power consumption for determining the temperature (or the temperature-dependent value usable for determining the temperature) can be reduced in at least some cases.

By way of example, the temperature sensor can be exposed to the first calibration temperature and the second calibration temperature in a calibration process during production of the temperature sensor and/or of the device within the first time interval. By way of example, the first calibration temperature and the second calibration temperature can be within a predefined measurement range of the temperature sensor. By way of example, a temperature difference between the first calibration temperature and the second calibration temperature can be greater than 5° K (or greater than 10° K, greater than 20° K, greater than 50° K).

By way of example, the first calibration measurement value can correspond to a first temperature measurement value or a first value proportional to the calibration temperature, and the second calibration measurement value can correspond to a second temperature measurement value or a second value proportional to the calibration temperature. By way of example, the calculation module 14 can be configured to determine the first calibration measurement value and the second calibration measurement value on the basis of proportional to absolute temperature (PTAT) sensor measurements, on the basis of the information about the temperature-dependent voltage difference. By way of example, the calculation module 14 can be configured to calculate the first calibration measurement value (temperature measurement value) and the second calibration measurement value (temperature measurement value) on the basis of a (predefined) first current flow via the first diode, a (predefined) second current flow via the second diode and the information about the temperature-dependent voltage difference. By way of example, the calculation module 14 can be configured to calculate the first calibration measurement value (temperature measurement value) on the basis of a first voltage drop in the case of the (predefined) first current flow at the first diode and the second calibration measurement value (temperature measurement value) on the basis of a second voltage drop in the case of the (predefined) second current flow at the second diode. By way of example, the calculation module 14 can be configured to determine the first calibration measurement value and the second calibration measurement value by means of a calculation function on the basis of the temperature-dependent voltage difference (or on the basis of the temperature-dependent voltage difference in relation to a reference voltage) or by means of a lookup table on the basis of the temperature-dependent voltage difference (or on the basis of the temperature-dependent voltage difference in relation to a reference voltage).

By way of example, the calculation module 14 can be configured to determine or to derive the first calibration voltage value at the temperature-dependent electrical component at the first calibration temperature on the basis of the information about the measurement value of the temperature-dependent voltage at the temperature-dependent electrical component at the first calibration temperature. By way of example, the calculation module 14 can be configured to determine or to derive the second calibration voltage value at the temperature-dependent electrical component at the second calibration temperature on the basis of the information about the measurement value of the temperature-dependent voltage at the temperature-dependent electrical component at the second calibration temperature. By way of example, the calculation module 14 can be configured to store the measurement value of the temperature-dependent voltage at the temperature-dependent electrical component at the first calibration temperature and at the second calibration temperature, for instance in a lookup table or as a parameter of a mathematical equation, for instance of a mathematical equation for a two point calibration. By way of example, the calculation module 14 can be configured to store the first calibration voltage value together with a value for the first calibration temperature and the second calibration voltage value together with a value for the second calibration temperature.

By way of example, the calculation module 14 can be configured to determine the temperature or the temperature-dependent value usable for determining the temperature by means of a mathematical function on the basis of a mathematical relationship between the first calibration voltage value at the first calibration temperature and the second calibration voltage value at the second calibration temperature. By using the mathematical function, the temperature (or the temperature-dependent value usable for determining the temperature) can be calculated for example from arbitrary values for the voltage at the temperature-dependent electrical component. By way of example, the mathematical relationship can correspond to an at least piecewise linear function. By way of example, the mathematical relationship can be based on a linearization of a diode characteristic curve of the temperature-dependent electrical component. By way of example, the calculation module 14 can be configured to determine the mathematical function on the basis of a voltage change in the case of a predefined temperature step or on the basis of a temperature change in the case of a predefined voltage step on the basis of the first calibration voltage value at the first calibration temperature and the second calibration voltage value at the second calibration temperature. By way of example, the calculation module 14 can be configured to determine the temperature or the temperature-dependent value usable for determining the temperature on the basis of the information about the measurement value of the temperature-dependent voltage at the temperature-dependent electrical component and on the basis of a two point calibration on the basis of the first calibration voltage value and on the basis of the second calibration voltage value. The two point calibration, in the case of (approximately) linear relationships, can enable a calculation of the temperature with a low calculation complexity and a determination of the parameter with (only) two calibration temperatures. By way of example, the two point calibration can be based on the first calibration voltage value at the first calibration temperature as first point and the second calibration voltage value at the second calibration temperature as second point. Alternatively, the calculation module 14 can be configured to determine the temperature or the temperature-dependent value usable for determining the temperature on the basis of the information about the measurement value of the temperature-dependent voltage at the temperature-dependent electrical component and on the basis of a multi-point calibration on the basis of at least the first calibration voltage value and the second calibration voltage value, for instance furthermore on the basis of a third calibration voltage value at a third calibration temperature.

By way of example, the calculation module 14 can be configured to determine the temperature or the temperature-dependent value usable for determining the temperature by means of a lookup table. Determining the temperature or the temperature-dependent value usable for determining the temperature on the basis of the lookup table can enable an implementation without a multiplication arithmetic unit. The lookup table can correspond to a data structure, for example. The lookup table can comprise for example a plurality of value pairs, for instance a plurality of calibration voltage value-calibration temperature pairs. The lookup table can be based on at least the first calibration voltage value and the second calibration voltage value. By way of example, the calculation module 14 can be configured to store at least the first calibration voltage value at the first calibration temperature (or the first calibration temperature at the first calibration voltage value) and the second calibration voltage value at the second calibration temperature (or the second calibration temperature at the second calibration voltage value) in the lookup table. By way of example, the device 10 can comprise a storage module, for instance a read only memory, configured to store the lookup table. The calculation module 14 can be configured to store the lookup table in the storage module and to retrieve it from the storage module. By way of example, the calculation module 14 can be configured to retrieve (for the purpose of determining the temperature or the temperature-dependent value usable for determining the temperature) from the lookup table a calibration temperature for that calibration voltage which comes closest to the measurement value of the temperature-dependent voltage at the temperature-dependent electrical component (from all the calibration temperatures that the lookup table comprises). By way of example, the calculation module 14 can be configured to determine the temperature or the temperature-dependent value usable for determining the temperature by interpolation between at least two calibration voltage values at least two calibration temperatures on the basis of the measurement value of the temperature-dependent voltage at the temperature-dependent electrical component.

By way of example, the calculation module 14 can be configured to determine a reference temperature on the basis of the information about the temperature-dependent voltage difference (for instance analogously to the determination of the first calibration measurement value (of the first temperature measurement value) at the first calibration temperature). The calculation module 14 can be configured to compare the determined temperature with the reference temperature and to determine anew the first calibration measurement value at the first calibration temperature, the second calibration measurement value at the second calibration temperature, the first calibration voltage value at the temperature-dependent electrical component at the first calibration temperature and the second calibration voltage value at the temperature-dependent electrical component at the second calibration temperature if a deviation between the reference temperature and the determined temperature is greater than a deviation threshold value, for instance if the deviation is greater than 0.1° K (or greater than 0.2° K, or greater than 0.5° K, or greater than 1° K). In this regard, by way of example, an accuracy of the determined temperature (or of the determined temperature-dependent value usable for determining the temperature) can be improved over a lifetime of the temperature sensor.

By way of example, the calculation module 14 can be configured to determine the temperature as a temperature value on a temperature scale (for instance to calculate it or to determine it on the basis of a lookup table), for instance on the Kelvin temperature scale, the Celsius temperature scale or the Fahrenheit temperature scale. The temperature-dependent value usable for determining the temperature can have for example an (at least piecewise linear) mathematical relationship with the temperature. By way of example, the temperature-dependent value can be in a predefined mathematical ratio to the temperature. By way of example, the temperature-dependent value usable for determining the temperature can be convertible into the temperature by a linear function (for instance within a predefined measurement range), for instance with a deviation of less than 2% (or less than 1%, or less than 0.5%) of the temperature or with a deviation of less than 0.2° K (or less than 0.1° K, or less than 0.05° K). By way of example, the determined temperature (or a temperature which can be determined from a conversion of the temperature-dependent value usable for determining the temperature) can have a deviation of less than 2% (or less than 1%, or less than 0.5%) of the temperature from the temperature of the temperature sensor.

By way of example, the interface 12 can be configured to receive the at least one measurement signal in series via at least one signal line. By way of example, the interface 12 can be configured, in the first time interval, to receive a first measurement signal comprising the information about the temperature-dependent voltage difference and, in the second time interval, to obtain a second measurement signal comprising the information about the measurement value of the temperature-dependent voltage, for instance via the same signal line or via different signal lines, as an analogue voltage or as a digital voltage value. Alternatively, the interface 12 can be configured to receive the at least one measurement signal in parallel as a plurality of signals via different signal lines. By way of example, the interface 12 can be configured to receive the information about the temperature-dependent voltage difference via a first signal line (for instance as an analogue voltage or as a digital voltage value) and to receive the information about the measurement value of the temperature-dependent voltage via a second signal line (for instance as an analogue voltage or as a digital voltage value).

The information about the temperature-dependent voltage difference between the first temperature-dependent voltage at the first diode of the temperature sensor and the second temperature-dependent voltage at the second diode of the temperature sensor can comprise for example information about the temperature-dependent voltage difference at the first calibration temperature and about the temperature-dependent voltage difference at the second calibration temperature. By way of example, the information about the temperature-dependent voltage difference can comprise one or a plurality of digital values of the temperature-dependent voltage difference. Alternatively or additionally, the information about the temperature-dependent voltage difference can comprise one or a plurality of digital values of the temperature-dependent voltage difference in relation to a reference voltage. Alternatively or additionally, the information about the temperature-dependent voltage difference can comprise one or a plurality of digital values of the first temperature-dependent voltage at the first diode of the temperature sensor and one or a plurality of digital values of the second temperature-dependent voltage at the second diode of the temperature sensor. Alternatively, the measurement signal can comprise one or a plurality of voltages that map the temperature-dependent voltage difference, for instance a difference voltage or the first temperature-dependent voltage at the first diode and the second temperature-dependent voltage at the second diode.

By way of example, the information about the measurement value of the temperature-dependent voltage can comprise a digital value of the temperature-dependent voltage or a digital value proportional to the value of the temperature-dependent voltage. A digital value of a voltage can correspond for example to a numerical approximation/representation to the value of the voltage. Alternatively, the measurement signal can comprise the temperature-dependent voltage. By way of example, the measurement signal can furthermore comprise information about the measurement value of the temperature-dependent voltage at the temperature-dependent electrical component at the first calibration temperature (as first calibration voltage value) and information about the measurement value of the temperature-dependent voltage at the temperature-dependent electrical component at the second calibration temperature (as second calibration voltage value), for instance as two or more digital values or as an analogue voltage at a first point in time and at a second point in time.

By way of example, the first time interval can correspond to a calibration time interval. The second time interval can correspond for example to an operation time interval. In some cases, the first time interval can temporally precede the second time interval. By way of example, the first time interval can be part of a production time of the temperature sensor. By way of example, the temperature sensor and/or the device can be in a calibration state in the first time interval. The temperature sensor and/or the device can be in an operating state or a normal state in the second time interval.

By way of example, the temperature-dependent electrical component of the temperature sensor can be the first diode or the second diode. Alternatively, the temperature-dependent electrical component can be a further diode or a thermistor of the temperature sensor, such as are presented in association with FIG. 2.

The interface 12 can correspond for example to one or more inputs and/or one or more outputs for receiving and/or transmitting information, for instance in digital bit values or as analogue values, on the basis of a code, within a module, between modules, or between modules of different entities. By way of example, the interface 12 can correspond to an interface for receiving a digital measurement signal from a control circuit of the temperature sensor. Alternatively, the interface 12 can be configured to obtain the measurement signal comprising one or more (analogue) voltages and to convert the one or more analogue voltages into digital voltage values for the calculation module 14.

By way of example, obtaining the at least one measurement signal can comprise obtaining one or more digital values, for instance in digital code sequences, or as packets in a packet based network. Alternatively, obtaining the at least one measurement signal can comprise obtaining one or more analogue voltages, for instance via the same input (for instance in a manner temporally delimited by a switch structure) or at different inputs. The interface 12 can be configured, for example, to obtain the at least one measurement signal via a two wire connection or three wire connection or via two or more signal lines having voltages representing the at least one measurement signal.

Figure 2:
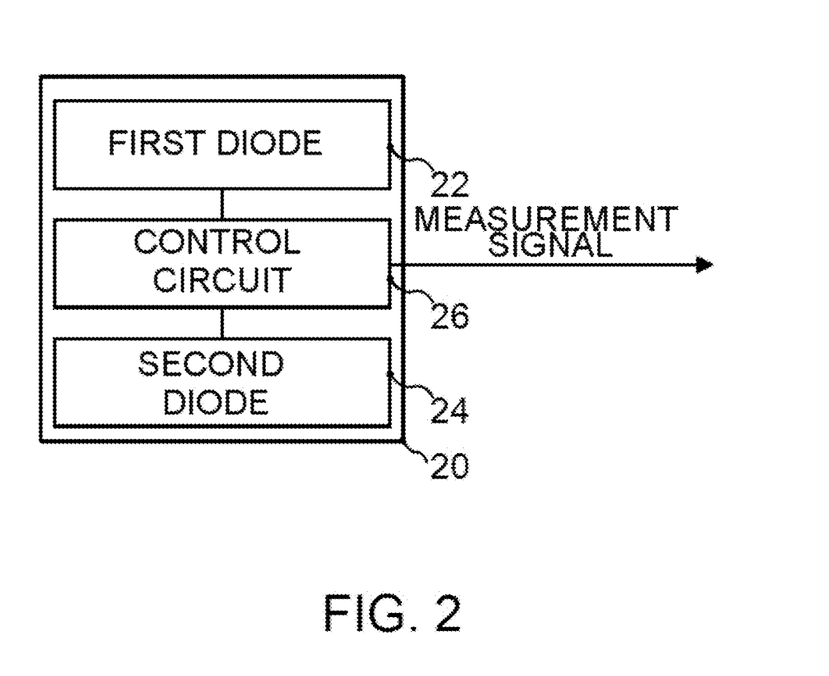
FIG. 2 shows a block diagram of a temperature sensor.

The temperature sensor can correspond for example to a temperature sensor such as is described in association with FIG. 2.

In exemplary embodiments, the calculation module 14 can correspond to an arbitrary controller or processor or a programmable hardware component. By way of example, the calculation module 14 can also be realized as software that is programmed for a corresponding hardware component. In this respect, the calculation module 14 can be implemented as programmable hardware having correspondingly adapted software. In this case, arbitrary processors, such as digital signal processors (DSPs), can be used. In this case, exemplary embodiments are not restricted to a specific type of processor. Arbitrary processors or even a plurality of processors are conceivable for implementing the calculation module 14. At least part of the calculation module 14 can be implemented by an application-specific circuit.

FIG. 2 shows a block diagram of a temperature sensor 20. The temperature sensor 20 comprises a first diode 22 and a second diode 24. The temperature sensor 20 furthermore comprises a control circuit 26, configured for providing at least one measurement signal (for instance at least one measurement signal as introduced in connection with FIG. 1) to an interface to a device for determining a temperature or a temperature-dependent value usable for determining the temperature (for instance a device 10 for determining a temperature or a temperature-dependent value usable for determining the temperature as introduced in conjunction with FIG. 1). The control circuit 26 is configured to control a generation of the at least one measurement signal, such that in a first time interval the at least one measurement signal comprises information about a temperature-dependent voltage difference between a first temperature-dependent voltage at the first diode 22 and a second temperature-dependent voltage at the second diode 24. The control circuit 26 is designed to control the generation of the at least one measurement signal, such that in a second time interval the at least one measurement signal comprises information about a measurement value of a temperature-dependent voltage at a temperature-dependent electrical component of the temperature sensor 20.

Providing the information about the temperature-dependent voltage difference in the first time interval (for instance during a calibration of the temperature sensor) and the information about the measurement value of the temperature-dependent voltage in the second time interval (for instance during normal operation of the temperature sensor) can reduce a power consumption of the temperature sensor in the second time interval and enable a calculation of the temperature (or of the temperature-dependent value usable for determining the temperature) even with a lower power consumption.

By way of example, the temperature-dependent electrical component can be the first diode 22 or the second diode 24. In this regard, an implementation with a smaller number of hardware components can be made possible. If the first diode is the temperature-dependent electrical component, then the control circuit 26 can be designed to interrupt a current flow via the second diode in the second time interval (analogously for the case where the second diode is the temperature-dependent electrical component). Alternatively, the temperature-dependent electrical component can be a further diode or a thermistor of the temperature sensor. This can enable a higher flexibility in the design of the temperature sensor. The further diode can be implemented for example in a manner similar to the first diode 22 or the second diode 24. If the electrical component is a further diode or a thermistor, then the control circuit 26 can be designed to interrupt a current flow via the first diode and via the second diode in the second time interval. By way of example, the thermistor can correspond to a resistance structure whose resistance value changes (substantially) linearly in a temperature dependent manner within a measurement range of the temperature sensor.

By way of example, the control circuit 26 can be implemented by one or more transistor structures, for instance by an application specific circuit. By way of example, the control circuit 26 can comprise one or more current sources, one or more amplifier structures and one or more switch structures. At least parts of the control circuit can be implemented by a controller, processor or a programmable hardware component, for instance in a manner similar to a calculation module 14 as introduced in conjunction with FIG. 1. By way of example, the control circuit can comprise an analogue to digital converter circuit. The analogue to digital converter circuit can be configured, for example, to provide the at least one measurement signal as at least one digital measurement signal to the interface. This can enable a simplified processing in the device. Furthermore, the at least one measurement signal can be transmitted for example by means of a smaller number of lines. By way of example, the control circuit 26 can comprise one or more switch structures configured to provide (alternatively) the first temperature-dependent voltage, the second temperature-dependent voltage and the temperature-dependent voltage at the temperature-dependent electrical component for the analogue to digital converter circuit.

By way of example, the information about the temperature-dependent voltage difference between the first temperature-dependent voltage at the first diode and the second temperature-dependent voltage at the second diode in the first time interval in the at least one digital measurement signal can be based on a first number of measurement samples. By way of example, the control circuit 26 (for instance the analogue to digital converter circuit) can be configured to determine the first temperature-dependent voltage at the first diode with one half of the first number of measurement samples by sampling and to determine the second temperature-dependent voltage at the second diode with the other half of the first number of measurement samples by sampling. The control circuit 26 can be configured to calculate the temperature-dependent voltage difference on the basis of the first temperature-dependent voltage and the second temperature-dependent voltage. Alternatively, the control circuit 26 (for instance the analogue to digital converter circuit) can be configured to determine the temperature-dependent voltage difference by way of a difference voltage between the first temperature-dependent voltage and the second temperature-dependent voltage with the first number of measurement samples by sampling. By way of example, the control circuit can comprise a differential amplifier for generating the difference voltage. The information about the measurement value of the temperature-dependent voltage at the temperature-dependent electrical component in the second time interval in the at least one digital measurement signal can be based on a second number of measurement samples. By way of example, the control circuit 26 (for instance the analogue to digital converter circuit) can be configured to determine the measurement value of the temperature-dependent voltage at the temperature-dependent electrical component with the second number of measurement samples by sampling. By way of example, the second number of measurement samples can be less than 20% (or less than 15%, less than 10%) of the first number of measurement samples. This can enable a faster measurement, for example, and thus result in a higher possible repetition rate of providing the information about the measurement value and a reduction of the power consumption for each determination of the information about the measurement value. By way of example, the control circuit can be designed/configured to provide the information about the temperature-dependent voltage difference only in the first time interval and/or not in the second time interval.

By way of example, the control circuit 26 can be configured to provide the information about the temperature-dependent voltage difference as part of a digital measurement signal (for instance by means of the analogue to digital converter circuit). By way of example, the information about the temperature-dependent voltage difference can comprise a digital value (for instance a binary coded value) of the temperature-dependent voltage difference. Alternatively or additionally, the information about the temperature-dependent voltage difference can comprise a digital value (for instance a binary coded value) of the temperature-dependent voltage difference in relation to a voltage reference. Alternatively, the control circuit 26 can be configured to control the generation of the at least one measurement signal such that the at least one measurement signal comprises the temperature-dependent voltage difference as an analogue difference voltage or the first temperature-dependent voltage and the second temperature-dependent voltage as analogue voltages. By way of example, the control circuit 26 can be configured to measure the temperature-dependent voltage difference, for instance as difference voltage or as first temperature-dependent voltage and as second temperature-dependent voltage. The control circuit 26 can be configured to calculate the voltage difference between the first temperature-dependent voltage and the second temperature-dependent voltage for the information about the temperature-dependent voltage difference.

By way of example, the control circuit 26 can be configured to provide the information about the measurement value as part of a digital measurement signal (for instance by means of the analogue to digital converter circuit). By way of example, the information about the measurement value can comprise a digital value (for instance a binary coded value) of the measurement value of the voltage at the temperature dependent component. Alternatively, the control circuit 26 can be configured to control the generation of the at least one measurement signal such that the at least one measurement signal comprises the measurement value of the voltage at the temperature dependent component (or the voltage at the temperature dependent component) as an analogue voltage. By way of example, the control circuit 26 can be configured to determine the information about the measurement value independently of at least the first diode 22 or the second diode 24. By way of example, the control circuit 26 can be configured to measure the measurement value of the voltage at the temperature dependent component.

By way of example, the first diode 22 and the second diode 24 can each comprise a pn junction. By way of example, the first diode 22 and the second diode 24 can be implemented by transistor structures. By way of example, the temperature sensor can comprise one or more bipolar transistors. The one or more bipolar transistors can comprise at least one element of the group of the first diode, the second diode and the temperature-dependent electrical component. By way of example, the first diode 22 and the second diode 24 can have substantially the same temperature dependent characteristic curves. By way of example, in the case of a first temperature dependent characteristic curve of the first diode 22 for a given forward voltage, a first forward current can be less than 5% (or less than 2%, or less than 1%, or less than 0.5%, or less than 0.2%) smaller or larger than a second forward current of a second temperature dependent characteristic curve of the second diode 24 for the given forward voltage. By way of example, the first diode 22 and the second diode 24 can be substantially identical in size and have a substantially identical doping. By way of example, first lateral and vertical dimensions of the first diode 22 can be less than 5% (or less than 2%, or less than 1%, or less than 0.5%) smaller or larger than the second lateral and vertical dimensions of the second diode 24. By way of example, the first diode 22 and the second diode 24 can be implemented on the same semiconductor substrate. By way of example, the temperature sensor can be designed such that the first diode is operated with a first predefined current flow and the second diode is operated with a second predefined current flow in order to generate the at least one measurement signal in the first time interval. By way of example, the first predefined current flow can be in a fixed ratio to the second predefined current flow, for example in a fixed integral ratio (for instance with a maximum deviation of less than 2% (or less than 1%, or less than 0.5%, or less than 0.2%, or less than 0.1%) of the first predefined current flow). By way of example, the first predefined current flow can be double the magnitude (or 4 times the magnitude, 8 times the magnitude, 10 times the magnitude) of the second predefined current flow. By way of example, the first diode 22 can be operated with a first, greater predefined current flow and the second diode 24 can be operated with a second, lower predefined current flow. By way of example, the control circuit 26 can be configured to control the generation of the at least one measurement signal in the first time period, such that the first diode is operated with a first, greater predefined current flow and the second diode is operated with a second, lower predefined current flow. By way of example, the temperature sensor 20 can be designed such that the first diode is operated with a first, greater predefined current flow and the second diode is operated with a second, lower predefined current flow in order to generate the at least one measurement signal in the first time interval. By way of example, the second diode can be the temperature-dependent electrical component. As a result, it is possible for example to reduce a power consumption of the temperature sensor when providing the measurement signal in the second time interval.

By way of example, the temperature sensor can furthermore comprise the device 10 for determining the temperature or a temperature-dependent value useable for determining the temperature as introduced in association with FIG. 1.

By way of example, the temperature sensor 20 can correspond to a temperature sensor for compensating for temperature effects on a further sensor. By way of example, the further sensor can correspond to a pressure sensor, a microphone or a gas sensor.

By way of example, the first diode, the second diode, the control circuit and the device for determining a temperature or a temperature-dependent value usable for determining the temperature can be implemented on the same semiconductor substrate. This can enable a more compact design of the temperature sensor. By way of example, the temperature sensor and the device for determining the temperature or the temperature-dependent value usable for determining the temperature can be implemented on the same semiconductor substrate or in the same chip. Alternatively, the temperature sensor and the device for determining the temperature or the temperature-dependent value usable for determining the temperature can be implemented on separate chips.

More details and aspects of the temperature sensor 20 will be mentioned in conjunction with the concept or examples that have been described above (e.g. FIG. 1). The temperature sensor 20 can comprise one or more additional optional features which correspond to one or more aspects of the proposed concept or of the described examples as described above or below.

Figure 3:
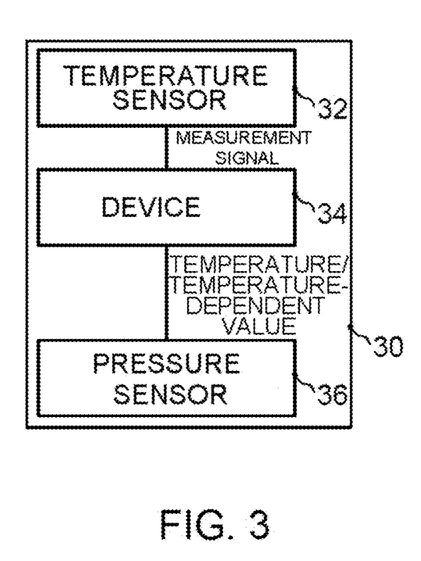
FIG. 3 shows a block diagram of a pressure sensor.

FIG. 3 shows a block diagram of a pressure sensor 30. The pressure sensor 30 comprises a temperature sensor 32, configured for providing at least one measurement signal. The temperature sensor 32 can be implemented for example in a manner similar to a temperature sensor 20 as introduced in conjunction with FIG. 2. The pressure sensor 30 furthermore comprises a device 34 for determining a temperature or a temperature-dependent value usable for determining the temperature. The device 34 can be implemented for example in a manner similar to a device 10 for determining a temperature or a temperature-dependent value usable for determining the temperature as introduced in conjunction with FIG. 1. The pressure sensor 30 furthermore comprises a pressure sensor device 36 having a membrane for pressure measurement, configured for determining an ambient air pressure (including an ambient temperature) on the basis of the information about the temperature or the information about the temperature-dependent value usable for determining the temperature.

The use of the device for determining the temperature or a temperature-dependent value usable for determining the temperature and of the temperature sensor makes it possible for example to reduce a power consumption of the pressure sensor in conjunction with a still high accuracy of the temperature measurement for compensating for temperature effects at the pressure sensor.

More details and aspects of the pressure sensor 30 will be mentioned in conjunction with the concept or examples that have been described above (e.g. FIGS. 1 and 2). The pressure sensor 30 can comprise one or more additional optional features which correspond to one or more aspects of the proposed concept or of the described examples as described above or below.

Figure 4:
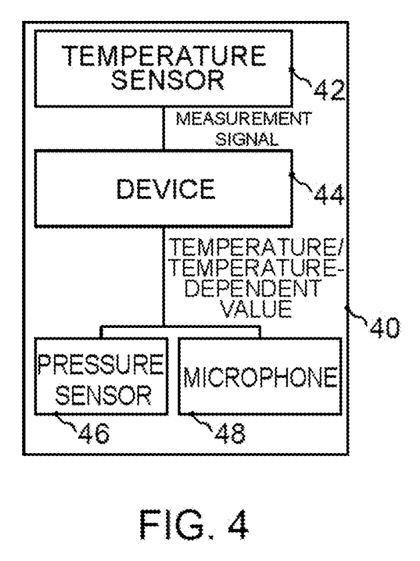
FIG. 4 shows a block diagram of a combination sensor.

FIG. 4 shows a block diagram of a combination sensor 40. The combination sensor 40 comprises a temperature sensor 42, configured for providing at least one measurement signal. The temperature sensor 42 can be implemented for example in a manner similar to a temperature sensor 20 as introduced in conjunction with FIG. 2. The combination sensor 40 furthermore comprises a device 44 for determining a temperature or a temperature-dependent value usable for determining the temperature. The device 44 can be implemented for example in a manner similar to a device 10 for determining a temperature or a temperature-dependent value usable for determining the temperature as introduced in conjunction with FIG. 1. The combination sensor 40 furthermore comprises a pressure sensor 46 having a membrane for pressure measurement, configured to determining an ambient air pressure (including an ambient temperature) on the basis of the information about the temperature or the information about the temperature-dependent value usable for determining the temperature. The combination sensor furthermore comprises a microphone 48 having a further membrane, configured for providing an audio signal (including the ambient temperature) and on the basis of the information about the temperature or the information about the temperature-dependent value usable for determining the temperature.

The use of the device for determining the temperature or a temperature-dependent value usable for determining the temperature and of the temperature sensor makes it possible for example to reduce a power consumption of the combination sensor in conjunction with a still high accuracy of the temperature measurement for compensating for temperature effects at the combination sensor.

In at least some examples, the microphone 48 can comprise the temperature sensor. The device 44 can be configured to determine the temperature or the temperature-dependent value usable for determining the temperature on the basis of the measurement signal of the temperature sensor of the microphone 48 and to provide it to the pressure sensor 46. By way of example, the microphone 48 and the pressure sensor 46 can be implemented as a circuit board stack or chip stack. By way of example, a control circuit of the microphone 48, a control circuit of the pressure sensor (46; 36), the device and/or the temperature sensor can be implemented as a circuit board stack or chip stack.

More details and aspects of the combination sensor 40 will be mentioned in conjunction with the concept or examples that have been described above (e.g. FIGS. 1 to 3). The combination sensor 40 can comprise one or more additional optional features which correspond to one or more aspects of the proposed concept or of the described examples as described above or below.

Exemplary embodiments furthermore provide a gas sensor, comprising a temperature sensor and a device for determining a temperature or a temperature-dependent value usable for determining the temperature, wherein the gas sensor is configured for detecting a gas including an ambient temperature on the basis of the temperature or the temperature-dependent value usable for determining the temperature.

Figure 5:
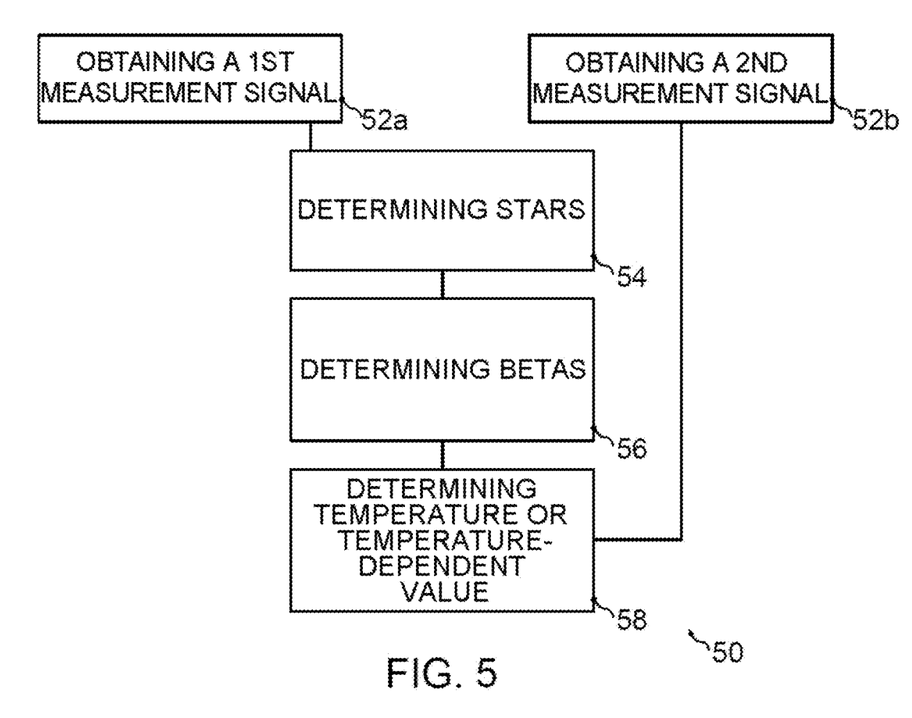
FIG. 5 shows a flow diagram of a method for determining a temperature or a temperature-dependent value usable for determining the temperature.

FIG. 5 shows a flow diagram of a method 50 for determining a temperature or a temperature-dependent value usable for determining the temperature. The method comprises obtaining 52a a first measurement signal from a temperature sensor in a first time interval. The first measurement signal comprises information about a temperature-dependent voltage difference between a first temperature-dependent voltage at a first diode of the temperature sensor and a second temperature-dependent voltage at a second diode of the temperature sensor. The method 50 furthermore comprises determining 54 at least one first calibration measurement value at a first calibration temperature and a second calibration measurement value at a second calibration temperature in the first time interval on the basis of the information about the temperature-dependent voltage difference. The method 50 furthermore comprises determining 56 at least one first calibration voltage value at the temperature-dependent electrical component at the first calibration temperature and a second calibration voltage value at the temperature-dependent electrical component at the second calibration temperature in the first time interval. The method furthermore comprises obtaining 52b a second measurement signal from the temperature sensor in a second time interval comprising information about a measurement value of a temperature-dependent voltage at a temperature-dependent electrical component of the temperature sensor. The method 50 furthermore comprises determining 58 the temperature or the temperature-dependent value usable for determining the temperature in the second time interval on the basis of the information about the measurement value of the temperature-dependent voltage at the temperature-dependent electrical component and on the basis of at least the first calibration voltage value or the second calibration voltage value.

Determining the first calibration measurement value and the first calibration voltage value at the first calibration temperature and the second calibration measurement value and the second calibration voltage value at the second calibration temperature can enable for example a calibration of the temperature sensor in the first time interval within the device, which can enable a high accuracy of the calibration, without relying on an external temperature measurement. In the second time interval, for example, the temperature (or the temperature-dependent value usable for determining the temperature) can be determined by way of the measurement value of the temperature-dependent voltage at a temperature-dependent electrical component of the temperature sensor, which can enable the first and/or the second diode to be deactivated, and which can furthermore enable the temperature to be determined on the basis of a smaller number of measurement samples. In this regard, a power consumption for determining the temperature (or the temperature-dependent value usable for determining the temperature) can be reduced in at least some cases.

By way of example, the at least one measurement signal in at least one of FIGS. 1-4 can comprise the first measurement signal and the second measurement signal. By way of example, the second measurement signal can also be received in the first time interval.

Exemplary embodiments furthermore provide a program comprising a program code for carrying out the method when the program code is executed on a computer, a processor, a control module or a programmable hardware component.

More details and aspects of the method 50 will be mentioned in conjunction with the concept or examples that have been described above (e.g. FIGS. 1 to 4). The method 50 can comprise one or more additional optional features which correspond to one or more aspects of the proposed concept or of the described examples as described above or below.

At least some examples relate to a diode (or some other temperature-dependent electrical component) as a high precision T sensor (temperature sensor) having an improved calibration.

A well-defined voltage having a negative temperature coefficient can be generated with the forward voltage of a pn junction diode. In the field of pressure sensors, this complementary to absolute temperature (CTAT) diode voltage can be used to compensate for a temperature dependent effect on the pressure read out. Furthermore, it is possible to offer the temperature in ° C. if the diode voltage is known with respect to absolute temperature behavior (PTAT, Proportional to Absolute Temperature). This may require a calibration that is as "good" as the a.) reference temperature and b.) diode linearity (a two point calibration requires linearity).

For pressure sensors, typically at least two temperature insertions are available in the production tester, but on account of limitations in available test systems it may possibly not be possible to provide these temperatures very exactly.

At least some examples provide a concept for setting/calibrating a temperature sensor by adding a high precision T sensor within the device, which sensor is used to provide an exact reference temperature.

For high precision temperature determination, some systems use exclusively a high precision T sensor, which can increase a power consumption and a measurement time. Further systems may for example set the temperature sensor by means of expensive test hardware with a stabilized reference temperature, which may lead to an expensive long test time and may enable fewer parallel tests.

By implementing a high precision T sensor it is possible, on the basis of the delta Vbe/Vbe measurement principle and using part of said sensor as only one Vbe (diode voltage) measurement, for the fine trimming of the diode voltage to be carried out very precisely, for example. In some examples, the high precision T sensor may never be used in the application (in normal operation) (saves power and measurement time). The high precision sensor might for example (only) be used: during a wafer test, it can be calibrated (only one analogue voltage measurement required), and during a pressure sensor calibration at the backend on package level, it is possible to read out the exact temperature on the chip by using the high precision sensor. This "reference temperature" can then be used in a two point calibration, for example, in order to deduce the temperature in ° C. from the voltage.

Figure 6:
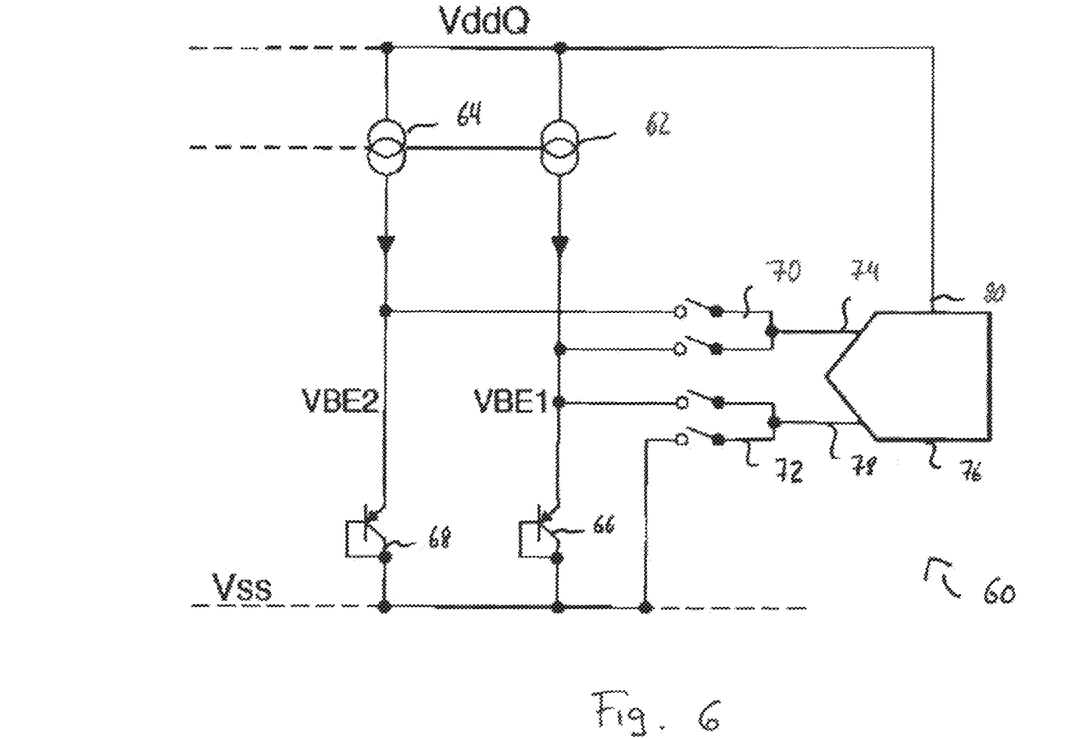
FIG. 6 shows a schematic diagram of a circuit of a temperature sensor.

A high precision T sensor using the dVbe/Vbe principle is shown in the block diagram in FIG. 6. FIG. 6 shows a schematic diagram of a circuit 60 of a temperature sensor comprising a first current source 62 and a second current source 64, both of which are connected to a reference voltage VddQ (VddQ). The first current source 62 provides a current (for a PTAT circuit) ten times the magnitude of that provided by the second current source 64. The circuit 60 furthermore comprises a first PNP bipolar transistor structure 66 with a first diode and a second PNP bipolar transistor structure 68 with a second diode. The emitter of the first PNP bipolar transistor structure 66 is connected to the first current source, and the collector and the base are connected to ground (VSS, VSS). The emitter of the second PNP bipolar transistor structure 68 is connected to the second current source, and the collector and the base are connected to ground (VSS). The circuit 60 furthermore comprises a first switch structure 70 and a second switch structure 72. The first switch structure 70 connects either a first base emitter voltage (VBE1, VBE1) at the first transistor structure 66 or a second base emitter voltage (VBE2, VBE2) at the second transistor structure 68 to a first input 74 of an analogue to digital converter structure 76. The second switch structure 72 connects either the first base emitter voltage (VBE1) at the first transistor structure 66 or ground (VSS) to a second input 78 of the analogue to digital converter structure 76. The analogue-to-digital converter structure 76 furthermore has an input 80 for the reference voltage VddQ as analogue to digital conversion reference voltage.

By means of measuring VBE1 and VBE2−VBE1=dVBE and the subsequent division, the resulting term DTEMP is an absolute (accurate) indication of the temperature. Process dependent factors are typically well known and encompassed in the calibration formula. DTEMP can correspond for example to the calibration measurement value.

$$D_{TEMP} = \frac{\alpha \times \left(\frac{V_{BE2} - V_{BE1}}{V_{REF}}\right)}{\frac{V_{BE1} + \alpha \times (V_{BE2} - V_{BE1})}{V_{REF}}} = \frac{\alpha \times \left(\frac{V_{BE2} - V_{BE1}}{V_{ddQ}}\right)}{\frac{V_{BE1} + \alpha \times (V_{BE2} - V_{BE1})}{V_{ddQ}}}$$

DTEMP can then be converted to a temperature in ° C. for example by means of the following formula (the latter also encompasses process dependent parameters in A' and B'):

$$T_{diode} [° C.] = A'^{*}D_{TEMP} + B'$$

This absolute (accurate) temperature can be used for example as a reference for a two point calibration of the VBE2 measurement; the coefficients A and B are determined:

$$T_{diode} = A^{*}V_{BE2} + B$$

Measurements of a precision that can be achieved only with one diode in one illustrative exemplary embodiment exhibit a deviation of less than 0.25° C. in a measurement range of between 20° C. and approximately 85° C. for the measurement on the basis of one diode, and a maximum deviation of approximately 0.6° at 40° C., with comparable values in the case of a dVbe/Vbe (dVBE/VBE) measurement. A saving of 64× for power and time measurement can be achieved in some examples (dVbe/Vbe with averaging of 2048 sampled values*4 with system chopping versus averaging of 256 sampled values only for the Vbe measurement).

At least some examples provide a general method for introducing a high precision diode temperature calibration algorithm. This can enable a precise temperature reading in ° C. (solely) by the measurement of a diode voltage, which can thus save measurement time and power. By way of example, a precise temperature reference may not be required during the calibration process. By way of example, no additional hardware may be required compared with a high precision sensor.

This can make it possible to offer pressure sensor products having narrow temperature specifications (e.g. +/−0.4° C. for 3 sigma—which is a requirement for smartphones), without the disadvantage of additional power consumption or reduced sampling rate for pressure or temperature. Particularly in the case of a combined product for microphones and pressure sensor ("combo sensor"), this method can be beneficial because it can use the available high precision T sensor (microphone) with a high updating rate (pressure sensor), without adversely affecting the accuracy.

Some systems may for example use expensive high precision testers having a low parallelism or various (other) temperature sensors (e.g. only on the basis of dVbe/Vbe with the disadvantage of more power consumption and lower updating rate).

More details and aspects of the temperature sensor and of the method will be mentioned in conjunction with the concept or examples that have been described above (e.g. FIGS. 1 to 5). The temperature sensor or the method can comprise one or more additional optional features which correspond to one or more aspects of the proposed concept or of the described examples as described above or below.

The features disclosed in the description above, the following claims and the accompanying figures may be of importance and implemented both individually and in any desired combination for the realization of an exemplary embodiment in the various configurations thereof.

Although some aspects have been described in association with a device, it goes without saying that these aspects also constitute a description of the corresponding method, such that a block or a component of a device should also be understood as a corresponding method step or as a feature of a method step. Analogously thereto, aspects that have been described in association with or as a method step also constitute a description of a corresponding block or detail or feature of a corresponding device.

Depending on specific implementation requirements, exemplary embodiments of the invention can be implemented in hardware or in software. The implementation can be effected using a digital storage medium, for example a floppy disk, a DVD, a Blu Ray disc, a CD, a ROM, a PROM, an EPROM, an EEPROM or a FLASH memory, a hard disk or some other magnetic or optical storage unit on which are stored electronically readable control signals which can interact or interact with a programmable hardware component in such a way that the respective method is carried out.

A programmable hardware component may be formed by a processor, a central processing unit (CPU), a graphics processing unit (GPU), a computer, a computer system, an application specific integrated circuit (ASIC), an integrated circuit (IC), a system on chip (SOC), a programmable logic element or a field programmable gate array (FPGA) with a microprocessor.

The digital storage medium may therefore be machine or computer-readable. Some exemplary embodiments thus comprise a data carrier having electronically readable control signals which are able to interact with a programmable computer system or a programmable hardware component in such a way that one of the methods described herein is carried out. One exemplary embodiment is therefore a data carrier (or a digital storage medium or a computer readable medium) on which the program for carrying out one of the methods described herein is recorded.

Generally, exemplary embodiments of the present invention may be implemented as a program, firmware, a computer program or a computer program product comprising a program code or as data, wherein the program code or the data is or are effective for carrying out one of the methods when the program runs on a processor or a programmable hardware component. The program code or the data may for example also be stored on a machine-readable carrier or data carrier. The program code or the data may be present, inter alia, as source code, machine code or byte code and as other intermediate code.

A further exemplary embodiment is furthermore a data stream, a signal sequence or a sequence of signals which constitute(s) the program for carrying out one of the methods described herein. The data stream, the signal sequence or the sequence of signals may be configured for example to the effect of being transferred via a data communication connection, for example via the internet or some other network. Exemplary embodiments are thus also data representing signal sequences which are suitable for being communicated via a network or a data communication connection, wherein the data constitute the program.

A program in accordance with one exemplary embodiment can implement one of the methods in the course of the latter being carried out for example by virtue of the fact that it reads out memory locations or writes one datum or a plurality of data thereto, thereby bringing about, if appropriate, switching processes or other processes in transistor structures, in amplifier structures or in other electrical components, optical components, magnetic components or components operating according to some other functional principle. Accordingly, by reading out a memory location, it is possible for data, values, sensor values or other information to be acquired, determined or measured by a program. Therefore, by reading out one or more memory locations, a program can acquire, determine or measure variables, values, measurement variables and other information and, by writing to one or more memory locations, said program can bring about, instigate or carry out an action and drive other devices, machines and components.

Advantages of some embodiments include the ability of a temperature sensor to determine a temperature with a high accuracy in conjunction with a reduced power consumption.

The exemplary embodiments described above constitute merely an illustration of the principles of the present invention. It goes without saying that modifications and variations of the arrangements and details described herein will become apparent to others skilled in the art. Therefore, the intention is for the invention to be restricted only by the scope of protection of the following patent claims rather than by the specific details presented herein on the basis of the description and the explanation of the exemplary embodiments.

What is claimed is:

1. A device for determining a temperature or a temperature-dependent value usable for determining the temperature, the device comprising:
   an interface configured for obtaining at least one measurement signal from a temperature sensor, wherein in a first time interval the at least one measurement signal comprises information about a temperature-dependent voltage difference between a first temperature-dependent voltage at a first diode of the temperature sensor and a second temperature-dependent voltage at a second diode of the temperature sensor, and wherein in a second time interval the at least one measurement signal comprises information about a measurement value of a temperature-dependent voltage at a temperature-dependent electrical component of the temperature sensor; and
   a calculation circuit configured for:
      determining at least one first calibration measurement value at a first calibration temperature and a second calibration measurement value at a second calibration temperature in the first time interval on the basis of the information about the temperature-dependent voltage difference,
      determining at least one first calibration voltage value at the temperature-dependent electrical component at the first calibration temperature and a second calibration voltage value at the temperature-dependent electrical component at the second calibration temperature in the first time interval, and
      determining the temperature or the temperature-dependent value usable for determining the temperature in the second time interval on the basis of the information about the measurement value of the temperature-dependent voltage at the temperature-dependent electrical component and on the basis of at least the first calibration voltage value or the second calibration voltage value.

2. The device as claimed in claim 1, wherein the calculation circuit is configured to determine the temperature or the temperature-dependent value usable for determining the temperature by using a mathematical function on the basis of a mathematical relationship between the first calibration voltage value at the first calibration temperature and the second calibration voltage value at the second calibration temperature.

3. The device as claimed in claim 1, wherein the calculation circuit is configured to determine the temperature or the temperature-dependent value usable for determining the temperature on the basis of the information about the measurement value of the temperature-dependent voltage at the temperature-dependent electrical component and on the basis of a two point calibration on the basis of the first calibration voltage value and on the basis of the second calibration voltage value.

4. The device as claimed in claim 1, wherein the calculation circuit is configured to determine the temperature or the temperature-dependent value usable for determining the temperature by using a lookup table, wherein the lookup table is based on at least the first calibration voltage value and the second calibration voltage value.

5. The device as claimed in claim 1, wherein the first calibration measurement value corresponds to a first temperature measurement value and the second calibration measurement value corresponds to a second temperature measurement value.

6. The device as claimed in claim 1, wherein the calculation circuit is configured to determine a reference temperature on the basis of the information about the temperature-dependent voltage difference, wherein the calculation circuit is configured to compare the determined temperature with the reference temperature and to determine anew the first calibration measurement value at the first calibration temperature, the second calibration measurement value at the second calibration temperature, the first calibration voltage value at the temperature-dependent electrical component at the first calibration temperature and the second calibration voltage value at the temperature-dependent electrical component at the second calibration temperature if a deviation between the reference temperature and the determined temperature is greater than a deviation threshold value.

7. The device as claimed in claim 1, wherein the calculation circuit comprises a processor.

8. A method for determining a temperature or a temperature-dependent value usable for determining the temperature, the method comprising:
   obtaining a first measurement signal from a temperature sensor, wherein in a first time interval the first measurement signal comprises information about a temperature-dependent voltage difference between a first temperature-dependent voltage at a first diode of the temperature sensor and a second temperature-dependent voltage at a second diode of the temperature sensor;

determining at least one first calibration measurement value at a first calibration temperature and a second calibration measurement value at a second calibration temperature in the first time interval on the basis of the information about the temperature-dependent voltage difference;

determining at least one first calibration voltage value at a temperature-dependent electrical component of the temperature sensor at the first calibration temperature and a second calibration voltage value at the temperature-dependent electrical component at the second calibration temperature in the first time interval; and obtaining a second measurement signal from the temperature sensor in a second time interval comprising information about a measurement value of a temperature-dependent voltage at the temperature-dependent electrical component; and determining the temperature or the temperature-dependent value usable for determining the temperature in the second time interval on the basis of the information about the measurement value of the temperature-dependent voltage at the temperature-dependent electrical component and on the basis of at least the first calibration voltage value or the second calibration voltage value.

9. The method as claimed in claim 8, wherein determining the temperature or the temperature-dependent value usable for determining the temperature is performed using a mathematical function on the basis of a mathematical relationship between the first calibration voltage value at the first calibration temperature and the second calibration voltage value at the second calibration temperature.

10. The method as claimed in claim 8, wherein determining the temperature or the temperature-dependent value usable for determining the temperature on the basis of the information about the measurement value of the temperature-dependent voltage at the temperature-dependent electrical component is performed on the basis of a two point calibration on the basis of the first calibration voltage value and on the basis of the second calibration voltage value.

11. The method as claimed in claim 8, wherein determining the temperature or the temperature-dependent value usable for determining the temperature is performed using a lookup table, wherein the lookup table is based on at least the first calibration voltage value and the second calibration voltage value.

12. The method as claimed in claim 8, wherein the first calibration measurement value corresponds to a first temperature measurement value and the second calibration measurement value corresponds to a second temperature measurement value.

13. The method as claimed in claim 8, further comprising:
determining a reference temperature on the basis of the information about the temperature-dependent voltage difference;
comparing the determined temperature with the reference temperature; and
determining anew the first calibration measurement value at the first calibration temperature, the second calibration measurement value at the second calibration temperature, the first calibration voltage value at the temperature-dependent electrical component at the first calibration temperature and the second calibration voltage value at the temperature-dependent electrical component at the second calibration temperature if a deviation between the reference temperature and the determined temperature is greater than a deviation threshold value.

* * * * *